(12) United States Patent
Yang et al.

(10) Patent No.: US 9,306,060 B1
(45) Date of Patent: Apr. 5, 2016

(54) SEMICONDUCTOR DEVICES AND RELATED FABRICATION METHODS

(71) Applicants: Hongning Yang, Chandler, AZ (US); Daniel J. Blomberg, Chandler, AZ (US); Xin Lin, Phoenix, AZ (US); Zhihong Zhang, Chandler, AZ (US); Jiang-Kai Zuo, Chandler, AZ (US)

(72) Inventors: Hongning Yang, Chandler, AZ (US); Daniel J. Blomberg, Chandler, AZ (US); Xin Lin, Phoenix, AZ (US); Zhihong Zhang, Chandler, AZ (US); Jiang-Kai Zuo, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 14/548,616

(22) Filed: Nov. 20, 2014

(51) Int. Cl.
*H01L 29/78* (2006.01)
*H01L 29/66* (2006.01)
*H01L 29/06* (2006.01)
*H01L 29/10* (2006.01)
*H01L 29/08* (2006.01)

(52) U.S. Cl.
CPC ........ *H01L 29/7823* (2013.01); *H01L 29/0634* (2013.01); *H01L 29/0646* (2013.01); *H01L 29/0865* (2013.01); *H01L 29/0882* (2013.01); *H01L 29/1095* (2013.01); *H01L 29/66681* (2013.01)

(58) Field of Classification Search
CPC ............... H01L 29/7823; H01L 29/66681; H01L 29/0634; H01L 29/1095; H01L 29/0865; H01L 29/0882; H01L 29/0646
See application file for complete search history.

(56) References Cited

U.S. PATENT DOCUMENTS

| | | | |
|---|---|---|---|
| 5,569,949 A | 10/1996 | Malhi | |
| 6,048,772 A | 4/2000 | D'Anna | |
| 6,352,901 B1 | 3/2002 | Chang | |
| 6,365,932 B1 | 4/2002 | Kouno et al. | |
| 8,193,585 B2 | 6/2012 | Grote et al. | |
| 8,489,353 B2 | 7/2013 | Raphael | |
| 2003/0085414 A1 | 5/2003 | Okuno et al. | |
| 2004/0065919 A1 | 4/2004 | Wilson et al. | |
| 2004/0094783 A1 | 5/2004 | Hong | |
| 2004/0145027 A1 | 7/2004 | Nitta et al. | |
| 2004/0238913 A1 | 12/2004 | Kwon et al. | |
| 2005/0001248 A1 | 1/2005 | Rhodes | |
| 2005/0073007 A1 | 4/2005 | Chen et al. | |
| 2006/0081836 A1 | 4/2006 | Kimura et al. | |

(Continued)

OTHER PUBLICATIONS

USPTO, Office Action in U.S. Appl. No. 14/495,508, mailed Sep. 16, 2015.

(Continued)

*Primary Examiner* — Long Pham

(74) *Attorney, Agent, or Firm* — Ingrassia Fisher & Lorenz, P.C.

(57) ABSTRACT

Semiconductor device structures and related fabrication methods are provided. An exemplary semiconductor device structure includes a body region of semiconductor material having a first conductivity type, a source region of semiconductor material having a second conductivity type within the body region, a junction isolation region of semiconductor material having the second conductivity type, a drain region of semiconductor material having the second conductivity type, and first and second drift regions of semiconductor material having the second conductivity type. The first drift region resides laterally between the drain region and the junction isolation region, the junction isolation region resides laterally between the first drift region and the second drift region, and the second drift region resides laterally between the body region and the junction isolation region.

20 Claims, 9 Drawing Sheets

(56) References Cited

U.S. PATENT DOCUMENTS

| | | |
|---|---|---|
| 2007/0164443 A1 | 7/2007 | Florian et al. |
| 2009/0085101 A1 | 4/2009 | Huang et al. |
| 2010/0032758 A1 | 2/2010 | Wang et al. |
| 2012/0112277 A1 | 5/2012 | Denison et al. |
| 2013/0032880 A1 | 2/2013 | Huang et al. |
| 2013/0175616 A1 | 7/2013 | Min et al. |
| 2013/0292764 A1 | 11/2013 | Yang et al. |
| 2014/0070311 A1 | 3/2014 | Yang et al. |
| 2014/0070312 A1 | 3/2014 | Yang et al. |

OTHER PUBLICATIONS

Utility U.S. Appl. No. 14/495,508, filed Sep. 24, 2014.
USPTO, Advisory Action Before the Filing of an Appeal Brief for U.S. Appl. No. 13/606,797, mailed Dec. 26, 2014.
USPTO, Non-Final Office Action for U.S. Appl. No. 13/606,797, mailed Mar. 10, 2014.
Adrian W. Ludikhuize, "A Review of Resurf Technology", the 12th International Symposium on Power Semiconductor Devices and ICs (ISPSD'2000), Copyright 2000 by the IEEE, Catalog No. 00CH37094C.
Piet Wessels, "Power Devices on SOI," MIGAS, Jun. 22, 2009.
USPTO, Response to Office Action for U.S. Appl. No. 13/606,797, mailed Jun. 9, 2014.
USPTO, Notice of Allowance and Fee(s) Due for U.S. Appl. No. 13/606,438, mailed Feb. 7, 2014.
I. Bertrand et al., "New lateral DMOS and IGBT structures realized on a partial SOI substrate based on LEGO process," IEEE BCTM 5.2 Conference Publication, pp. 74-77 (2005).
Remy Charavel et al., "N-Sinker formation by Phosphorous Silicon Glass Diffusion," 14th annual conference, ON Semiconductor Technical Paper, pp. 1-5 (2011).
USPTO, Office Action for U.S. Appl. No. 13/606,438, mailed Oct. 9, 2013.
USPTO, Final Office Action for U.S. Appl. No. 13/606,797, mailed Oct. 3, 2014.
Yang, Hongning, US Patent Application entitled "Semiconductor Device and Related Fabrication Methods," filed on Oct. 30, 2014.
Yang, Hongning, US Patent Application entitled "Drain-End Drift Diminution in Semiconductor Devices," filed on Sep. 15, 2014.
USPTO, Notice of Allowance and Fee(s) Due for U.S. Appl. No. 13/606,797, mailed Mar. 18, 2015.
USPTO, Final Office Action for U.S Appl. No. 14/495,508 mailed Jan. 15, 2016.

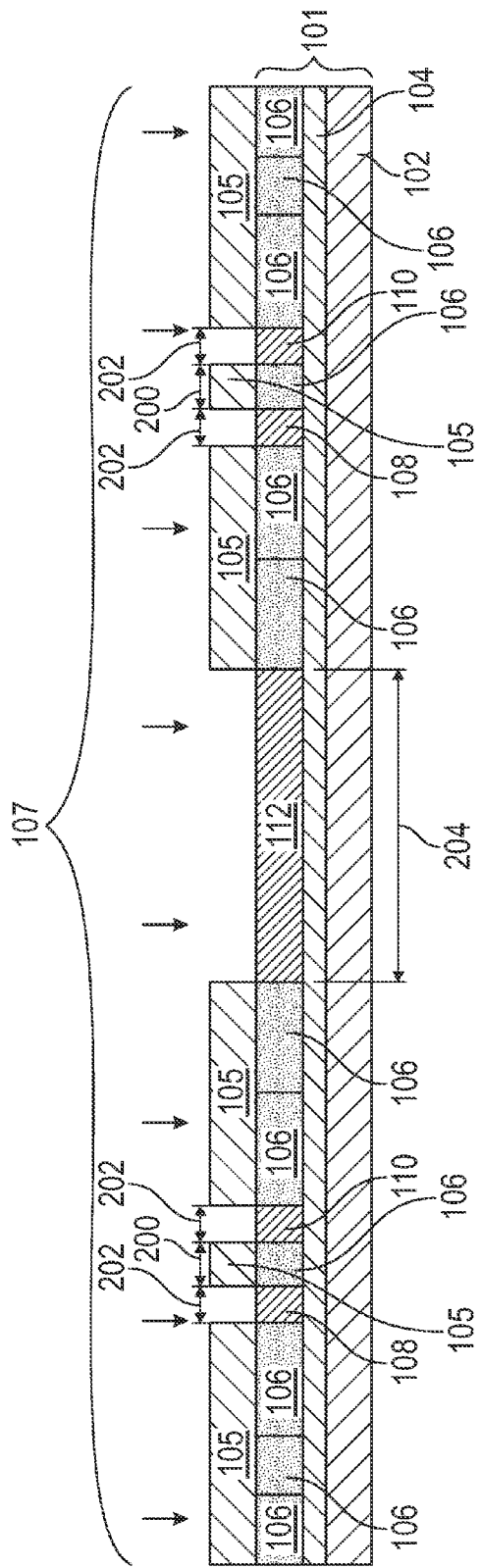
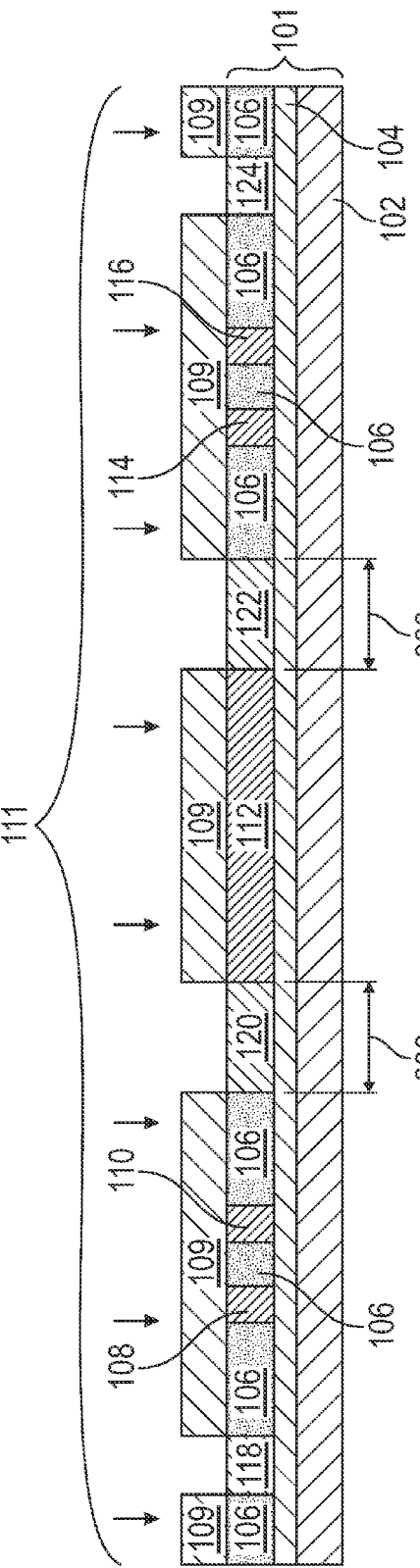

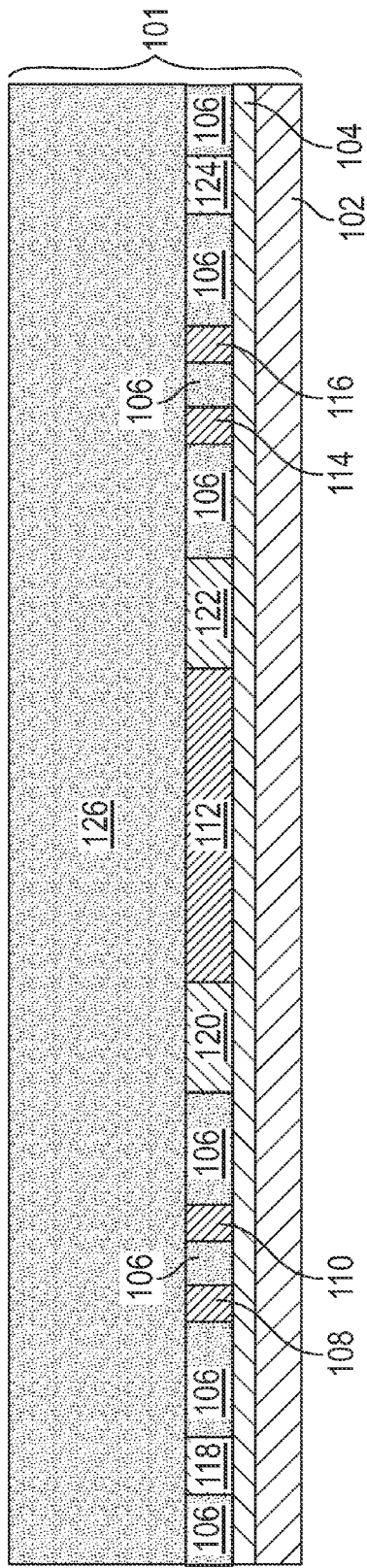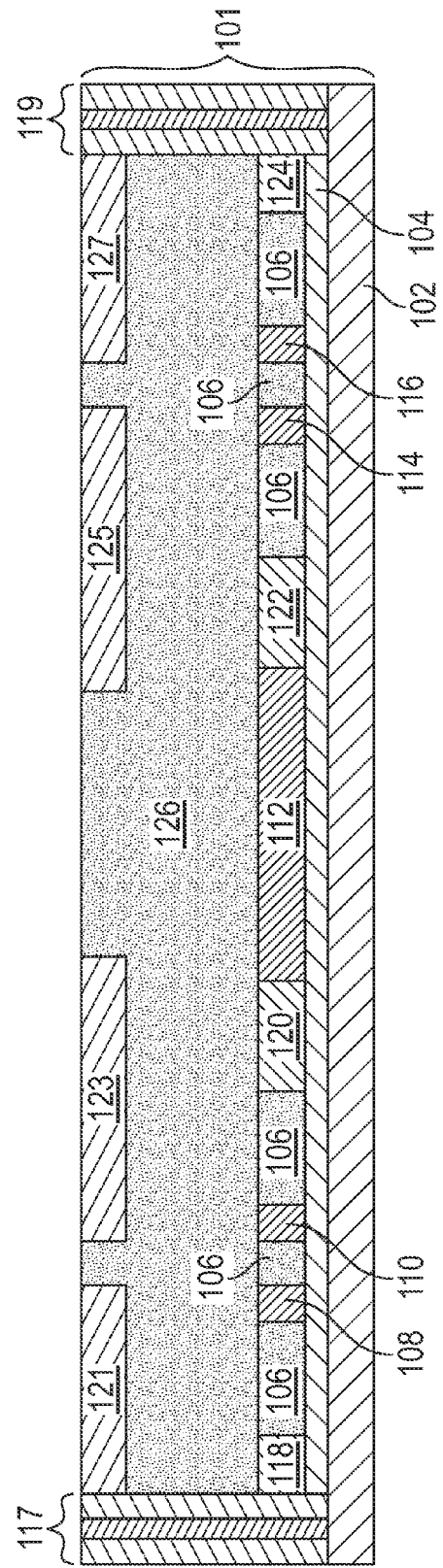

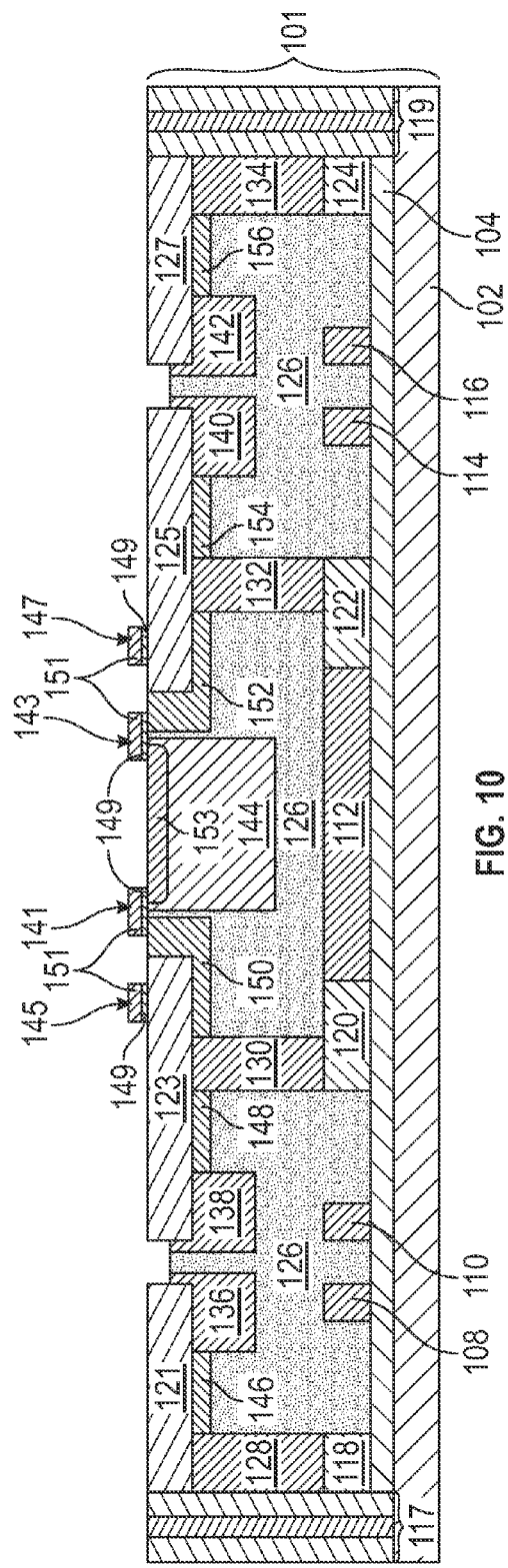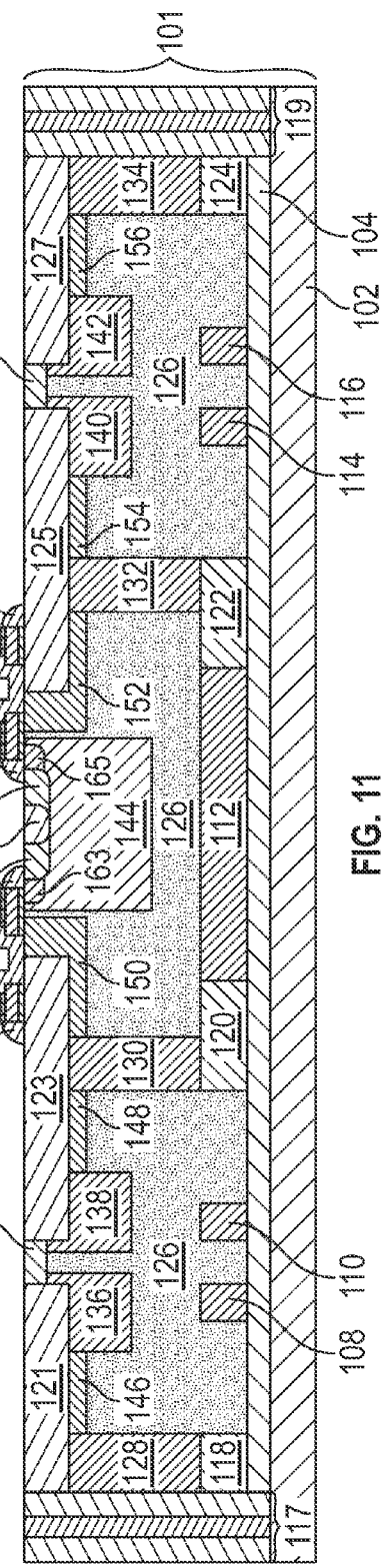

SEMICONDUCTOR DEVICES AND RELATED FABRICATION METHODS

TECHNICAL FIELD

Embodiments of the subject matter described herein relate generally to semiconductor devices and methods for fabricating semiconductor devices, and more particularly, embodiments of the subject matter relate to methods for fabricating semiconductor devices having increased breakdown voltage.

BACKGROUND

During normal operation, the voltage applied to a semiconductor device is constrained by the breakdown voltage of the device, which is the minimum applied voltage that causes avalanche breakdown in the device. For example, the rated drain-to-source voltage of a transistor device is typically set to a value that is well below the drain-to-source voltage that causes avalanche breakdown in the device to provide sufficient margin that accommodates a relatively large safe operation region, manufacturing variations or transient voltage fluctuations.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

FIGS. 2-12 illustrate, in cross section, exemplary methods for fabricating the semiconductor device structure of FIG. 1 in accordance with one or more embodiments of the invention.

DETAILED DESCRIPTION

Figure 1:
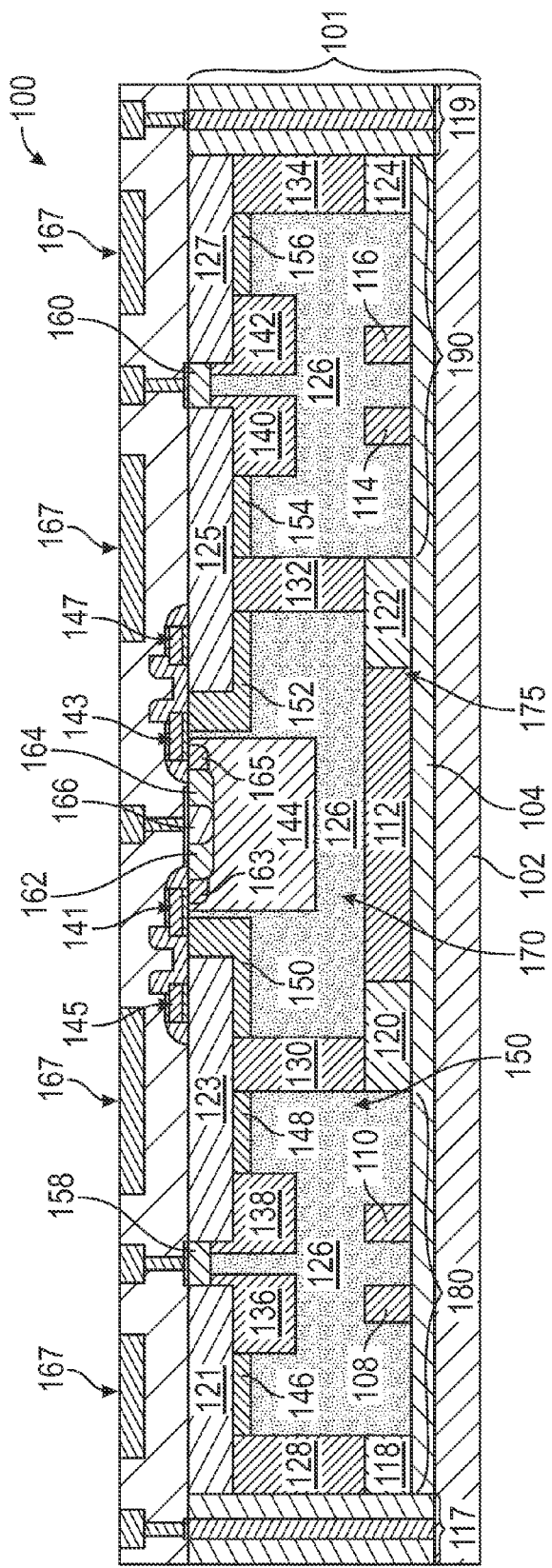
FIG. 1 illustrates, in cross section, a semiconductor device structure in accordance with one or more embodiments of the invention.

In practice, it is desirable to increase the breakdown voltage of transistor devices to accommodate a higher rated drain-to-source voltage or otherwise increase the margin, and thereby relax design windows or manufacturing requirements. Accordingly, embodiments of the present invention distribute the drain voltage in a manner that increases or otherwise improves the drain-to-source breakdown voltage.

Exemplary semiconductor device structures described herein include a body region formed within a semiconductor substrate that is surrounded, enclosed, or otherwise isolated from surrounding regions of the semiconductor substrate having the same conductivity by a junction isolation region having the opposite conductivity. In this regard, the junction isolation region provides p-n junction isolation that prevents the flow of current between the body region and the surrounding regions of the same conductivity. A source region of the semiconductor device having the same conductivity as the junction isolation region is formed within the body region and a drain region is formed in an adjacent surrounding region of the same conductivity as the body region, with the junction isolation region residing laterally between the drain region and the source region.

In exemplary embodiments, a first drift region having the same conductivity as the drain region is formed in the adjacent region of the substrate such that the first drift region resides laterally between the drain region and the junction isolation region, and a second drift region having the same conductivity as the drain region is formed in the body region of the substrate such that the second drift region resides laterally between the junction isolation region and the source region. As used herein, a "drift region" should be understood as referring to a doped region of semiconductor material between a relatively higher doped drain region (or drain electrode contact region) and a channel region of a transistor device. The drift region supports the voltage bias at the drain region by distributing or otherwise dissipating the voltage (or electrical potential) of the drain region throughout the drift region. The drift region also provides a conductive path for current between the channel region and the drain region. In this regard, the second drift region provides a conductive path for current between the junction isolation region and a channel portion of the body region that resides laterally between the source region and the second drift region, while the first drift region provides a conductive path for current between the drain region and the junction isolation region.

The drift regions and the junction isolation cooperate to provide a conductive path for current between the channel region and the drain region that distributes the drain voltage laterally and increases the lateral breakdown voltage between the drain and source regions. Additionally, the drift regions and the junction isolation are also configured to distribute the drain voltage vertically, as described in greater detail below. In this regard, in practice, some devices experience breakdown vertically beneath the drain before lateral breakdown between the drain and source occurs, and thus, increasing the vertical breakdown voltage further improves the rated drain-to-source breakdown voltage (BVDSS). As described in greater detail below, in exemplary embodiments, buried regions of semiconductor material having the same conductivity as the drain and source regions underlying the drift regions are utilized provide double reduced surface field (RE-SURF) effects, which, in concert with overlying conductive metal portions or dummy gate structures that are tied (e.g., short-circuited or directly connected) to the gate voltage, more fully deplete the drift regions and further increase the BVDSS.

FIG. 1 depicts a cross-sectional view of a semiconductor device structure 100 in accordance with exemplary embodiments of the present invention. The semiconductor device structure 100 includes a laterally diffused metal oxide semiconductor (LDMOS) field-effect transistor structure fabricated on a silicon-on-insulator (SOI) substrate 101. Although "MOS" properly refers to a device having a metal gate electrode and an oxide gate insulator, the subject matter may be utilized with any semiconductor device that includes a conductive gate electrode (whether metal or other conductive material) positioned with respect to a gate insulator (whether oxide or other insulator) positioned with respect to a semiconductor substrate to implement a field-effect transistor. Thus, the invention is not intended to be limited to a metal gate electrode and an oxide gate insulator. Furthermore, it should be appreciated that although the subject matter is described herein in the context of an N-type (or N-channel) device, the subject matter is not intended to be limited to N-type devices and may be implemented in an equivalent manner for a P-type (or P-channel) device (e.g., by interchanging the conductivities of the doped regions).

For an N-type transistor device (e.g., an NLDMOS device), an interior P-type body portion 170 (including interior P-type regions 126, 144, 166) of the transistor structure is separated from surrounding drain portions 180, 190 of the transistor structure by an N-type junction isolation region 175 (comprised of N-type constituent regions 112, 120, 122, 130, 132)

that provides p-n junction isolation between the drain portions 180, 190 and the body portion 170. In this regard, the P-type body portion 170 is enclosed by the N-type junction isolation region 175. The junction isolation region 175 forms an isolated NLDMOS with "virtual" drain regions 130, 132 of the isolation region 175 having a voltage supported by interior drift regions 150, 152. This isolated NLDMOS can itself sustain certain voltage and can laterally share a portion of the "real" drain voltage applied at drain contact regions 158, 160, thereby leading to a reduction of lateral stress. When the "virtual" drain is biased higher, the potential of the entire isolation region 175 will be lifted, and so is the potential of the dielectric layer 104, which will effectively reduce the vertical voltage stress between the "real" drain (regions 158, 160) and the dielectric layer 104. The isolated NLDMOS enables significant reduction of both lateral and vertical electrical stress within the drain portions 180, 190 and results in higher BVDSS compared to a traditional LDMOS. For purposes of explanation, but without limitation, the junction isolation region 175 is alternatively referred to herein as an isolation ring.

Corner portions 120, 122 of the N-type isolation ring 175 underlie portions of overlying N-type lateral drift regions 150, 152 within the P-type body region 170, with portions of P-type semiconductor material 126 of the P-type body portion 170 vertically residing between the lateral drift regions 150, 152 and the buried N-type regions 120, 122 to provide a double RESURF effect. The N-type isolation ring 175 also provides a lateral electrical interconnection between the lateral drift regions 150, 152 within the P-type body portion 150 and drift regions 138, 140, 148, 154 within the neighboring drain portions 180, 190 of the substrate 101. Lateral drift regions 148, 154 abutting the isolation ring 175 are electrically connected to the drain regions 158, 160 via drift well regions 138, 140 that abut or otherwise contact both a respective lateral drift region 148, 154 and a respective drain region 158, 160. The drift regions 138, 140, 148, 154 within the drain portions 180, 190 may be shaped to achieve increased depletion both laterally and vertically, thereby increasing the voltage that may be distributed or otherwise supported by the drain portions 180, 190 of the transistor structure. In this regard, the drift well regions 138, 140 may be configured to increase the vertical distribution of the drain voltage; thus, for purposes of explanation but without limitation, the drift well regions 138, 140 are alternatively referred to herein as vertical drift regions. In exemplary embodiments, lightly doped N-type buried regions 110, 114 are also provided within the drain portions 180, 190 underlying the vertical drift regions 138, 140 to provide a double RESURF effect within the drain portions 180, 190 and further increase the vertical distribution of the drain voltage.

As described in greater detail below, the N-type isolation ring 175 includes a central (or interior) portion 112 of N-type semiconductor material that underlies the P-type body well region 144 having the source regions 162, 164 and body contact region 166 formed therein. The central portion 112 of the isolation ring 175 abuts the underlying isolation layer 104 of the SOI substrate 101. The central portion 112, alternatively referred to herein as a lightly doped N-type buried region, has a dopant concentration that, in exemplary embodiments, is a few orders less than the dopant concentration of corner portions 120, 122 of the isolation ring 175. In the illustrated embodiment, the corner portions 120, 122 of the isolation ring 175 abut the central portion 112 and the underlying isolation layer 104. N-type sinker regions 130, 132 overlie and abut the corner portions 120, 122 and extend vertically from the respective corner portions 120, 122 to the surface of the semiconductor substrate 101 (or the surface isolation regions 123, 125). The inner sinker regions 130, 132 laterally separate the P-type semiconductor material 126 of the interior body portion 170 from the neighboring P-type semiconductor material 126 of the drain portions 180, 190. In one or more embodiments, the dopant concentration of the sinker regions 130, 132 is less than or equal to the dopant concentration of the corner portions 120, 122 but greater than or equal to the dopant concentration of the central portion 112.

In exemplary embodiments, the interior N-type lateral drift regions 150, 152 are formed within the P-type semiconductor material 126 of the body portion 170 and extend laterally inward from a respective sinker region 130, 132 towards the interior (or central) P-type body well region 144. In exemplary embodiments, the depth of the drift regions 150, 152 is less than the respective depths of the sinker regions 130, 132, which enables the formation of double RESURF (n-p-n) region under the drift regions 150, 152 (e.g., the portions of the P-type material 126 vertically between the drift regions 150, 152 and the bottom of the isolation ring 175). The illustrated drift regions 150, 152 abut or otherwise contact the sinker regions 130, 132 to establish an electrical connection between the interior drift regions 150, 152 and the drift and drain regions 138, 140, 148, 154, 158, 160 within the drain portions 180, 190, as described in greater detail below. In exemplary embodiments, the dopant concentration of interior N-type lateral drift regions 150, 152 is less than the dopant concentration of the N-type sinker regions 130, 132 by roughly one order of magnitude or more. For example, in one or more embodiments, the dopant concentration of interior N-type lateral drift regions 150, 152 is on the order of about $1 \times 10^{16}/cm^3$, while the dopant concentration of the sinker regions is on the order of about $1 \times 10^{17}/cm^3$ or greater.

As described in greater detail below, in exemplary embodiments, the P-type semiconductor material 126 is realized as a relatively lightly doped epitaxial layer of semiconductor material. For example, the dopant concentration of the P-type epitaxial semiconductor material 126 may be in the range of about $1 \times 10^{13}/cm^3$ to about $4 \times 10^{15}/cm^3$. The P-type body well region 144 is formed within the P-type epitaxial semiconductor material 126 of the body portion 170 with a dopant concentration that is greater than the dopant concentration of the epitaxial material 126 and a depth that is less than a thickness of the epitaxial layer, such that at least a portion of the P-type epitaxial material 126 resides vertically between the P-type body well region 144 and the underlying portion 112 of the N-type isolation ring 175. For example, in one or more embodiments, the P-type body well region 144 has a dopant concentration in the range of about $5 \times 10^{16}/cm^3$ to about $5 \times 10^{17}/cm^3$ and a depth such that the thickness of the underlying P-type material 126 between the P-type body well region 144 and the N-type portion 112 is at least 0.5 microns. In the illustrated embodiment, the lateral boundaries of the P-type body well region 144 are offset from the proximal lateral boundary of the respective drift regions 150, 152 by a nonzero separation distance to ensure that at least a portion of the P-type semiconductor material 126 underlies a respective gate structure 141, 143 near the surface of the substrate 101 to achieve a lower on resistance. However, in alternative embodiments, the P-type body well region 144 may abut the interior lateral drift regions 150, 152.

Relatively highly doped N-type source regions 162, 164 are formed within the P-type body well region 144 with a depth that is less than the depth of the P-type body well region 144. For example, the source regions 162, 164 may have a dopant concentration in the range of about $1 \times 10^{19}/cm^3$ to about $1\times10^{21}/cm^3$ and a depth of about 100 nanometers (nm). Additionally, shallow laterally diffused source extension regions 163, 165 may be formed within the P-type body well region 144 to reside laterally between a respective source region 162, 164 and respective channel regions adjacent to the drift region 150, 152 underlying a respective gate structure 141, 143. Each of the source extension regions 163, 165 abuts a respective source region 162, 164 and has a dopant concentration that is less than that of the source regions 162, 164, while the depth of source extension regions 163, 165 is equal or less than that of the source regions 162, 164. For example, the source extension regions 163, 165 may have a dopant concentration in the range of about $1\times10^{17}/cm^3$ to about $1\times10^{19}/cm^3$ and a depth of about 100 nanometers (nm) or less. P-type body contact region 166 is formed within the P-type body well region 144 to a depth that is less than the depth of the P-type body well region 144 and with a dopant concentration that is greater than the P-type body well region 144. For example, the P-type body contact region 166 may have a dopant concentration in the range of about $1\times10^{19}/cm^3$ to about $1\times10^{21}/cm^3$ and a depth of about 100 nanometers (nm). In exemplary embodiments, the P-type body contact region 166 is disposed at or near the center of the device structure 100 and resides laterally between the respective source regions 162, 164.

Relatively highly doped N-type drain regions 158, 160 are formed within interior (or central) portions of the P-type semiconductor material 126 of the respective drain portions 180, 190. In exemplary embodiments, the drain regions 158, 160 are formed concurrently with the source regions 162, 164, and thereby have substantially the same depth and dopant concentration. In exemplary embodiments, the drain regions 158, 160 are electrically connected to the N-type isolation ring 175 via one or more drift regions 138, 140, 148, 154. In exemplary embodiments, each respective N-type drain region 158, 160 abuts or otherwise contacts a respective N-type vertical drift region 138, 140, which, in turn, abuts or otherwise contacts a respective N-type lateral drift regions 148, 154 that abuts a respective N-type sinker region 130, 132. In this manner, drift regions 138, 148 and sinker region 130 cooperate to electrically connect a first drain region 158 to a first interior lateral drift region 150 and drift regions 140, 154 and sinker region 132 cooperate to electrically connect a second drain region 160 to a second interior lateral drift region 152.

In exemplary embodiments, the depth of the vertical drift regions 138, 140 can be greater than the depth of the lateral drift regions 148, 154 to increase the vertical distribution of the drain voltage, and also, allow the vertical drift regions 138, 140 to be depleted laterally by the adjacent portions of P-type semiconductor material 126 underlying a respective lateral drift region 148, 154 between a respective vertical drift region 138, 140 and a respective sinker region 130, 132. Additionally, the depth of the vertical drift regions 138, 140 is less than a thickness of the epitaxial layer such that at least a portion of the P-type epitaxial material 126 resides vertically between a respective vertical drift region 138, 140 and a respective underlying N-type doped region 110, 114 to achieve vertical depletion of the vertical drift regions 138, 140. In exemplary embodiments, the dopant concentration of the vertical drift regions 138, 140 is less than the dopant concentration of the drain regions 158, 160. For example, in one or more embodiments, the dopant concentration of the vertical drift regions 138, 140 is greater than or equal to the dopant concentration of the lateral drift regions 148, 154. As described in greater detail below, in one or more exemplary embodiments, the lateral drift regions 148, 154 are formed concurrently with the interior drift regions 150, 152.

In the illustrated embodiment, the buried doped regions 110, 114 vertically distribute the drain voltage underneath the vertical drift regions 138, 140 towards the insulating layer 104 and reduces the percentage of the drain voltage that is vertically distributed by the underlying P-type semiconductor material 126 between the drain regions 158, 160 and the upper surfaces of the portions of the insulating layer 104 that underlie the drain regions 158, 160. The insulating layer 104 provides a capacitance capable of distributing the drain voltage vertically, and thus, by reducing the percentage of the drain voltage that is vertically distributed by the P-type semiconductor material 126 underneath the drain regions 158, 160, the percentage of the drain voltage that is vertically supported by (or distributed across) the capacitance provided by the insulating layer 104 is increased. Accordingly, the vertical breakdown voltage (e.g., between the drain regions 158, 160 and the underlying insulating layer 104) of the LDMOS transistor device is increased. In exemplary embodiments, the buried doped regions 110, 114 are laterally positioned near the drain regions 158, 160 without actually underlying the drain regions 158, 160 to provide a double RESURF effect. For example, the exterior lateral boundaries of buried doped regions 110, 114 may be vertically aligned with an interior lateral boundary of a respective drain region 158, 160. However, in alternative embodiments, the buried regions 110, 114 may be vertically aligned with a respective drain region 158, 160 such that at least a portion of a buried region 110, 114 underlies a respective drain region 158, 160. In exemplary embodiments, the buried regions 110, 114 are formed concurrently to the central portion 112 of the isolation ring 175, and accordingly, have substantially the same dopant concentration as the central portion 112. In this regard, the dopant concentration of the buried regions 110, 114 is less than the dopant concentration of the drift regions 138, 140, 148, 154 by roughly an order of magnitude or more.

Still referring to FIG. 1, in exemplary embodiments, the drift regions 138, 140, 148, 154 and the buried regions 110, 114 within the drain portions 180, 190 are mirrored substantially symmetrically between the drain regions 158, 160 and the edges of the device structure 100 prevent premature breakdown between the drain regions 158, 160 and the isolation regions at the edges of the device structure 100. In this regard, each respective drain region 158, 160 also abuts or contacts a respective mirrored N-type vertical drift region 136, 142, which, in turn, abuts or otherwise contacts a respective mirrored N-type lateral drift region 146, 156 that abuts a respective edge protection region formed at a respective edge of the device structure 100 adjacent to a respective isolation region. In a similar manner, the N-type sinker regions 130, 132 that provide the vertical edges of the isolation ring 175 are mirrored substantially symmetrically to provide the respective edge protection regions comprised of an N-type sinker region 128, 134 and a buried N-type region 118, 124. In exemplary embodiments, the vertical drift regions 138, 140 and the mirrored vertical drift regions 136, 142 are formed concurrently and the depths, widths, and dopant concentrations, of the mirrored vertical drift regions 136, 142 are substantially equal to those of the vertical drift regions 138, 140. Similarly, the lateral drift regions 148, 154 and the mirrored lateral drift regions 146, 156 are formed concurrently and the depths, widths, and dopant concentrations, of the mirrored lateral drift regions 146, 156 are substantially equal to those of the lateral drift regions 148, 154. Likewise, the buried regions 110, 114 and the mirrored buried regions 108, 116 are formed concurrently and the thicknesses, widths, and dopant concentrations, of the mirrored buried regions 108, 116 are substantially equal to those of the buried regions 110, 114. As described below, the N-type sinker regions 128, 130, 132, 134 may also be concurrently formed with substantially the same depths, widths, and dopant concentrations. Additionally, the buried regions 118, 120, 122, 124 may be concurrently formed with the same thickness and dopant concentrations, however, in exemplary embodiments, the edge protection buried regions 118, 124 have a width that is substantially equal to the overlying edge protection sinker regions 128, 134, which may be less than the width of the corner portions 120, 122 of the isolation ring 175.

FIGS. 2-12 illustrate, in cross-section, methods for fabricating the semiconductor device structure 100 in accordance with exemplary embodiments of the present invention. Various steps in the manufacture of MOS devices are well known and so, in the interest of brevity, many conventional steps will only be mentioned briefly herein or will be omitted entirely without providing the well-known process details. Moreover, although the subject matter is described herein in the context of forming the LDMOS transistor in epitaxial silicon, the subject matter is not limited to epitaxial silicon and an equivalent LDMOS transistor structure may be fabricated on bulk semiconductor material or other non-epitaxial semiconductor material in an appropriate manner. It should be noted that in some embodiments, the semiconductor device structure 100 may be rectangular, square, or circular in shape or otherwise formed so that the regions depicted as being separate in the cross-sections of FIGS. 1-12 may be integral or otherwise continuous, as will be appreciated in the art. For example, the drift portions 180, 190 may be integral or contiguous with the isolation ring 175 laterally surrounding the body portion 170 located substantially at the center of the semiconductor device structure 100. Thus, in some practical embodiments, regions depicted as separate in the cross-sectional view may be realized as portions of a contiguous (or continuous) annular (or rectangular) doped region.

Referring to FIG. 2, in exemplary embodiments, fabrication of the semiconductor device structure 100 begins by providing or obtaining the SOI substrate 101 having a support (or handle) layer 102 of semiconductor material, an insulating layer 104 of dielectric material on or overlying the support layer 102, and a layer 106 of semiconductor material on or overlying the insulating layer 104. In exemplary embodiments, the layer 106 of semiconductor material is utilized to epitaxially grow additional semiconductor material 126 for subsequently fabricating one or more transistor devices thereon, and accordingly, for convenience, but without limitation, the layer 106 of semiconductor material may alternatively be referred to herein as the seed layer. In an exemplary embodiment, the semiconductor material of each of the layers 102, 106 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 102, 106 may be realized as germanium, gallium arsenide, gallium nitride, and the like, or one or more of the layers 102, 106 may include layers of different semiconductor materials.

In accordance with one embodiment, the insulating layer 104 is realized as an oxide layer formed in a subsurface region of the semiconductor substrate 101, also known as a buried oxide (BOX) layer. For example, the buried oxide layer 104 may be formed by oxidizing a wafer of semiconductor material (e.g., seed layer 106) which is then bonded to the support layer 102 to provide the buried layer 104 of oxide material between the support layer 102 and the seed layer 106. In exemplary embodiments, the support layer 102 and the seed layer 106 are each lightly doped. For example, for an N-type device, the seed layer 106 may be realized as a P-type silicon material having a P-type dopant concentration (e.g., boron ions or a boron ionized species) in the range of about $1 \times 10^{13}$/cm³ to about $1 \times 10^{17}$/cm³. Similarly, the support layer 102 may also be doped with the same (or different) conductivity-determining impurity type as the seed layer 106. It should be understood that the fabrication process described herein is not constrained by the substrate of semiconductor material utilized, and the fabrication process described herein may also be used to create devices from a bulk semiconductor substrate.

In exemplary embodiments, relatively lightly doped buried regions 108, 110, 112, 114, 116 having an opposite conductivity type to that of the seed layer 106 are formed within the seed layer 106. The buried doped regions 108, 110, 114, 116 underlie the vertical drift regions 136, 138, 140, 142 proximate the drain regions 158, 160 to increase the vertical distribution of the drain voltage, and thereby increase the breakdown voltage by reducing the voltage at the p-n junction underneath the drain regions 158, 160. Similarly, the central buried region 112 increases the voltage at the surface of the insulating layer 104 underneath the body well region 144 to increase the breakdown voltage between the source regions 162, 164 and the insulating layer 104. The doped regions 108, 110, 112, 114, 116 are formed by masking the semiconductor device structure 100 with an implantation mask 105 that is patterned to expose the underlying regions of the seed layer 106 to be used for the subsequently formed doped regions 108, 110, 112, 114, 116. Portions of the implantation mask 105 between respective pairs of doped regions 108, 110, 114, 116 remain intact to mask portions of the seed layer 106 that will underlie the drain regions 158, 160.

After forming the implantation mask 105, the doped regions 108, 110, 112, 114, 116 are then formed by implanting ions of the conductivity-determining impurity type opposite the conductivity of the seed layer 106, illustrated by arrows 107, in the exposed seed layer 106. In exemplary embodiments, for an N-channel semiconductor device having a P-type seed layer 106, N-type ions, such as phosphorous ions or antimony ions, are implanted into the seed layer 106 with a dopant concentration that is between $1 \times 10^{15}$/cm³ to about $5 \times 10^{16}$/cm³. The ions may be implanted at an energy level of in the range of about 0.5 megaelectron volt (MeV) to about 1 MeV to provide the doped regions 108, 110, 112, 114, 116 having a depth or thickness (after subsequent thermal annealing and any other diffusion) that is equal to the thickness of the seed layer 106. For example, in accordance with one embodiment, for a seed layer 106 with a thickness in the range of about 0.2 microns to about 1.0 microns, the doped regions 108, 110, 112, 114, 116 are formed by implanting N-type ions with a dopant concentration of about $2 \times 10^{16}$/cm³ and an energy level of about 1 MeV to provide doped regions 108, 110, 112, 114, 116 having a depth equal to the thickness of the seed layer 106. In this regard, the lower boundaries of the doped regions 108, 110, 112, 114, 116 abut the insulating layer 104. In some embodiments, the doped regions 108, 110, 112, 114, 116 are formed concurrently to a light N-type barrier layer (LNBL) in other device regions of the semiconductor substrate 101 (e.g., the same ion implantation 107 is used to form the LNBL).

The separation distance 200 (or spacing) between the interior boundaries of the doped regions 108, 110, 114, 116 (or alternatively, the width of the portion of the seed layer 106 between a respective pair of regions 108, 110, 114, 116) is greater than or equal to the width of the subsequently-formed drain regions, 158, 160. In this regard, the internal lateral boundaries of a respective pair of doped regions 108, 110, 114, 116 are vertically aligned with or outwardly offset from the external lateral boundaries of the subsequently-formed overlying drain region 158, 160. For example, in exemplary embodiments, the separation distance 200 between the doped regions 108, 110 is in the range of about 1.5 microns to about 2 microns to accommodate an overlying drain region 158 having a width in the range of about 1.5 microns or less. In exemplary embodiments, the width 202 of the doped regions 108, 110, 114, 116 is less than 1.5 microns (typically about 1 micron). A relatively narrow width 202 concentrates the vertical distribution of the drain voltage provided by the buried regions 108, 110, 114, 116 at or near the portions of the insulating layer 104 proximate to or underlying the drain regions 158, 160, and thereby minimizes lateral distribution of the drain voltage by the buried regions 108, 110, 114, 116. In exemplary embodiments, the outer lateral boundaries of the doped regions 108, 110, 114, 116 do not extend laterally beyond the lateral boundaries of the subsequently-formed vertical drift regions 136, 138, 140, 142 so that portions of the doped regions 108, 110, 114, 116 do not underlie subsequently-formed lateral drift regions 146, 148, 154, 156. The width 204 of the central buried region 112 is chosen to achieve optimized break down voltage between the overlying P-type body regions 126, 144 and the underlying dielectric layer 104, and may be in the range of about 1 micron to about 10 microns. In exemplary embodiments, the width 204 of the central buried region 112 is greater than the width of the subsequently-formed overlying body well region 144 and extends laterally to underlie at least an interior portion of the interior lateral drift regions 150, 152.

Referring now to FIG. 3, relatively heavier doped buried regions 118, 120, 122, 124 having the opposite conductivity type to that of the seed layer 106 are also formed within the seed layer 106. The more heavily doped inner buried regions 120, 122 underlie the subsequently-formed sinker regions 130, 132 and allow effective lifting of electric potential of the buried dielectric layer 104 to further increase the vertical distribution of the drain voltage by the capacitance of the dielectric layer 104. In this manner, the vertical voltage stress between the drain regions 158, 160 and the dielectric layer 104 is reduced, thereby increasing the breakdown voltage. Additionally, the more heavily doped outer buried regions 118, 124 underlie the subsequently-formed edge protection sinker regions 128, 134 to inhibit breakdown at or along the edge of the device structure 100. The inner buried regions 120, 122 also extend laterally underneath at least a portion of the interior lateral drift regions 150, 152 to provide a double RESURF effect. The doped regions 118, 120, 122, 124 are formed by masking the semiconductor device structure 100 with an implantation mask 109 that is patterned to expose the underlying regions of the seed layer 106 to be used for the subsequently-formed doped regions 118, 120, 122, 124, then formed by implanting ions of the conductivity-determining impurity type opposite the conductivity of the seed layer 106, illustrated by arrows 111, into the exposed seed layer 106. In exemplary embodiments, for an N-channel semiconductor device having a P-type seed layer 106, N-type ions are implanted with a dopant concentration in the range of about $1\times10^{18}/cm^3$ to about $1\times10^{19}/cm^3$ and at an energy level of in the range of about 1 megaelectron volt (MeV) to about 2 MeV to provide the doped regions 118, 120, 122, 124 having a depth or thickness (after subsequent thermal annealing and any other diffusion) that is greater than the thickness of the seed layer 106. In this regard, the lower boundaries of the doped regions 118, 120, 122, 124 abut the insulating layer 104. In some embodiments, the doped regions 118, 120, 122, 124 are formed concurrently to a normal N-type barrier layer (NBL) in other device regions of the semiconductor substrate 101 (e.g., the same ion implantation 111 is used to form the NBL).

As described above, the width 300 of the inner buried regions 120, 122 is chosen to extend underneath the interior lateral drift regions 150, 152. For example, if the width of the subsequently-formed sinker regions 128, 130, 132, 134 is 2 microns, the width 300 of the inner buried regions 120, 122 may be chosen to be 4 microns so that they extend underneath the interior lateral drift regions 150, 152 by at least 2 microns when the outer lateral boundaries of the buried regions 120, 122 are vertically aligned with those of the sinker regions 130, 132. In exemplary embodiments, where the outer lateral boundaries of the buried regions 120, 122 are vertically aligned with those of the sinker regions 130, 132, the outer buried regions 118, 124 are formed with substantially the same width as the sinker regions 128, 134 such that they are vertically aligned.

Turning now to FIG. 4, after forming the buried doped regions, the fabrication process continues by forming or otherwise providing an epitaxial layer 126 of semiconductor material on the seed layer 106 to provide an active region of semiconductor material having a desired thickness and conductivity. For an N-type device, the epitaxial layer 126 is formed by epitaxially growing silicon material on the seed layer 106 and in-situ doping the silicon material by adding boron ions (or other P-type ions) to the reactants used to epitaxially grow the layer 126. In one or more embodiments, for an N-type device, the epitaxial layer 126 has a P-type dopant concentration (e.g., boron ions or a ionized species) in the range of about $1\times10^{13}/cm^3$ to about $4\times10^{15}/cm^3$. The epitaxial layer 126 may be grown to a thickness such that a total thickness of the active region (e.g., the sum of the thickness of the seed layer 106 and the epitaxial layer 126) is in the range of about 0.5 microns to about 20 microns. It will be appreciated that the total thickness of the active region may vary depending on the needs of a particular application. In one or more embodiments, the dopant concentration of the epitaxial layer 126 may be substantially equal to the dopant concentration of the seed layer 106 (e.g., on the same order of magnitude). Additionally, for an N-type device, the interior (or central) P-type epitaxial material 126 within the body portion 170 that is surrounded by the N-type isolation ring 175 functions as a lightly doped portion of the body, and thus, may alternatively be referred to as a lightly doped body region.

After forming the epitaxial layer 126, the illustrated fabrication process continues by forming isolation regions, resulting in the device structure illustrated in FIG. 5. In an exemplary embodiment, the fabrication process isolates the LDMOS device structure from adjacent semiconductor devices by performing deep trench isolation (DTI) to provide deep isolation regions 117, 119 of dielectric material. For example, to form deep isolation regions 117, 119, the interior portion of the device structure 100 is masked with a masking material that is subsequently patterned to expose the peripheral portions of the epitaxial layer 126 and seed layer 106, which are then etched until the buried layer 104 is exposed. Thereafter, a dielectric material, such as an oxide material, may be deposited in the trenches or grown on exposed surfaces of the trenches to fill the trenches. Thereafter, conductive (or semiconductive) contacts to the support layer 102 are formed within the dielectric material, resulting in the illustrated deep isolation regions 117, 119. To form the conductive contacts, the device structure 100 is masked with a mask that is patterned to expose interior portions of the dielectric material of the deep isolation regions 117, 119. The dielectric material is then etched to a depth that is greater than or equal to the combined thickness of the epitaxial layer 126, the seed layer 106, and the buried layer 104 to expose the support layer 102. A conductive (or semiconductive) material, such as a polysilicon material, is then deposited to fill the trenches, resulting in conductive contacts that may be utilized to bias the support layer 102 to a desired electrical potential (e.g., electrical ground).

Shallow isolation regions 121, 123, 125, 127 of a dielectric material are also formed in the upper surface of the substrate 101 by performing shallow trench isolation (STI). To form the shallow isolation regions 121, 123, 125, 127, portions of the epitaxial layer 126 are masked with a masking material that is patterned to expose portions of the epitaxial layer 126 corresponding to the drift regions and sinker regions 128, 130, 132, 134, while masking portions of the epitaxial layer 126 corresponding to the drain and body well regions of the device. The exposed portions of the epitaxial layer 126 are then etched to a desired depth (which is less than the thickness of the epitaxial layer 126), and a dielectric material, such as an oxide material, may be deposited to fill the trenches, resulting in shallow isolation regions 121, 123, 125, 127. In accordance with one or more exemplary embodiments, the depth of the shallow isolation regions 121, 123, 125, 127 is in the range of about 0.05 microns to about 1 micron, and more preferably, within the range of 0.2 microns to 0.5 microns.

Figure 6:
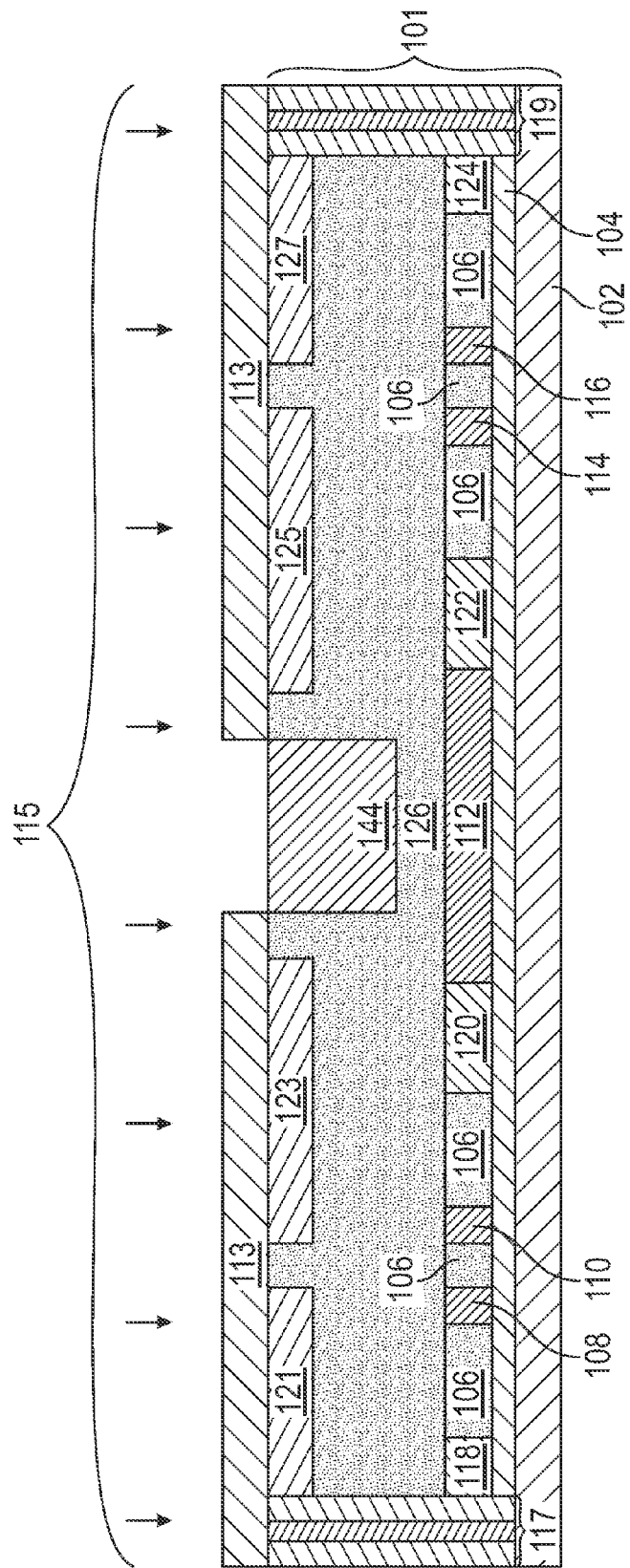

Referring now to FIG. 6, the illustrated fabrication process continues by forming a more heavily doped body well region 144 of semiconductor material within the body portion 170 of the substrate 101. The body well region 144 is formed by masking the drain portions 180, 190 and peripheral portions of the body portion 170 with a masking material 113 and implanting ions (illustrated by arrows 115) of the same conductivity-determining impurity type as the epitaxial layer 126 in the interior (or central) portion of the body portion 170 with a dopant concentration that is greater than the dopant concentration of the epitaxial layer 126. For example, P-type body well region 144 may be formed by implanting P-type ions with a dopant concentration in the range of about $5\times10^{16}/cm^3$ to about $5\times10^{17}/cm^3$ in a series of one or more implants having energy levels in the range of about 20 keV to about 500 keV to provide the body well region 144 having a depth in the range of about 0.5 microns to about 1.5 microns relative to the surface of the substrate 101. The depth of the body well region 144 is less than the thickness of the epitaxial layer 126 so that at least a portion of the lighter doped P-type epitaxial material 126 resides vertically between the body well region 144 and the lighter doped buried region 112 of the isolation ring 175.

Figure 7:
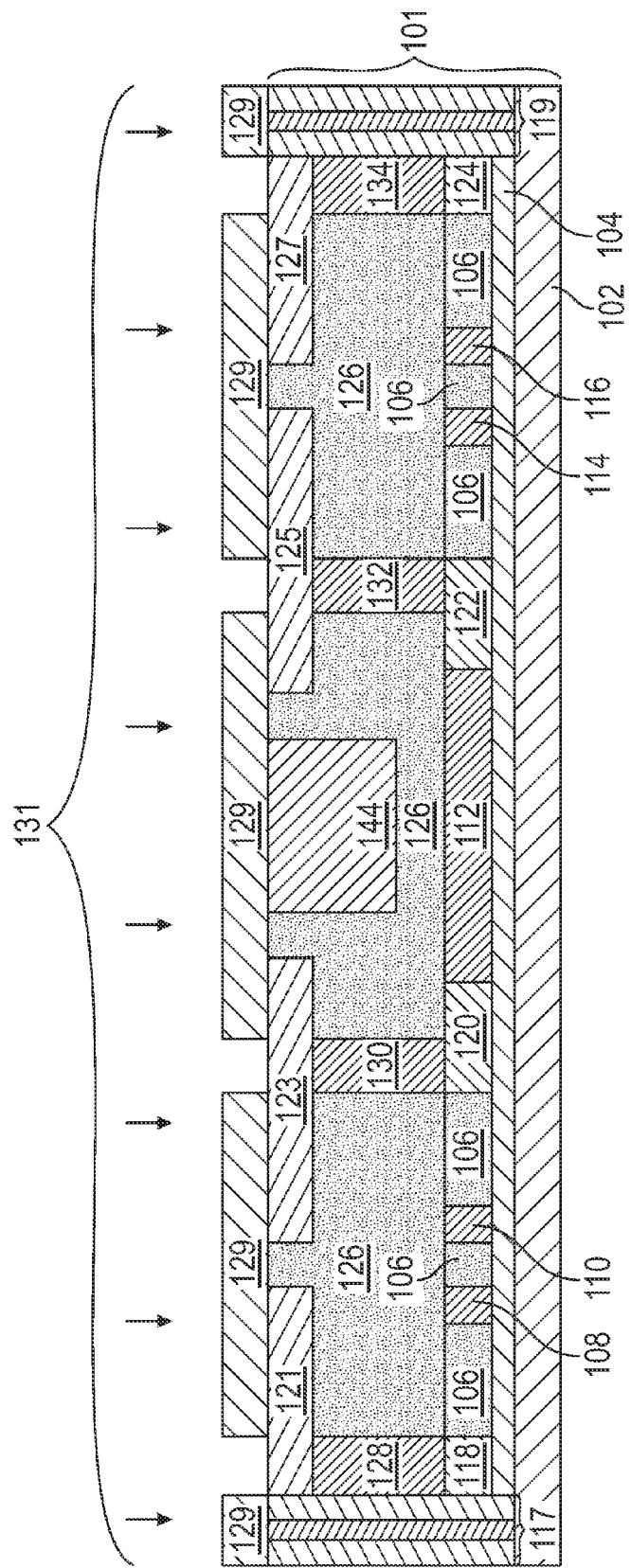

Referring now to FIG. 7, the fabrication process continues by masking portions of the epitaxial layer 126 and forming doped sinker regions 128, 130, 132, 134 of semiconductor material having the opposite conductivity type within the epitaxial layer 126. The doped sinker regions 128, 130, 132, 134 are formed by masking the substrate 101 with a masking material 129 that is patterned to provide an implantation mask that exposes the inner portions of the epitaxial layer 126 to be used for the inner doped sinker regions 130, 132 and also exposes peripheral portions of the epitaxial layer 126 to be used for peripheral doped sinker regions 128, 134 that abut the deep trench isolation regions 117, 119. For example, N-type sinker regions 128, 130, 132, 134 are formed by implanting N-type ions, illustrated by arrows 131, in the epitaxial layer 126 with a dopant concentration in the range of about $1\times10^{16}/cm^3$ to about $1\times10^{19}/cm^3$, and more preferably within the range of about $5\times10^{17}/cm^3$ to about $8\times10^{18}/cm^3$. In exemplary embodiments, the ions are implanted at an energy level in the range of about 1000 keV to about 3000 keV to provide N-type sinker regions 128, 130, 132, 134 with a depth (after subsequent thermal annealing or any other diffusion) corresponding to the thickness of the epitaxial layer 126 so that the N-type sinker regions 128, 130, 132, 134 extend to and abut the N-type buried regions 118, 120, 122, 124, thereby electrically connecting the N-type sinker regions 128, 130, 132, 134 to the respective N-type buried regions 118, 120, 122, 124. As illustrated, the inner N-type sinker regions 130, 132 define the isolation ring 175 and partition the P-type epitaxial layer 126 into the interior (or central) body portion 170 and the surrounding drain portions 180, 190.

Figure 8:
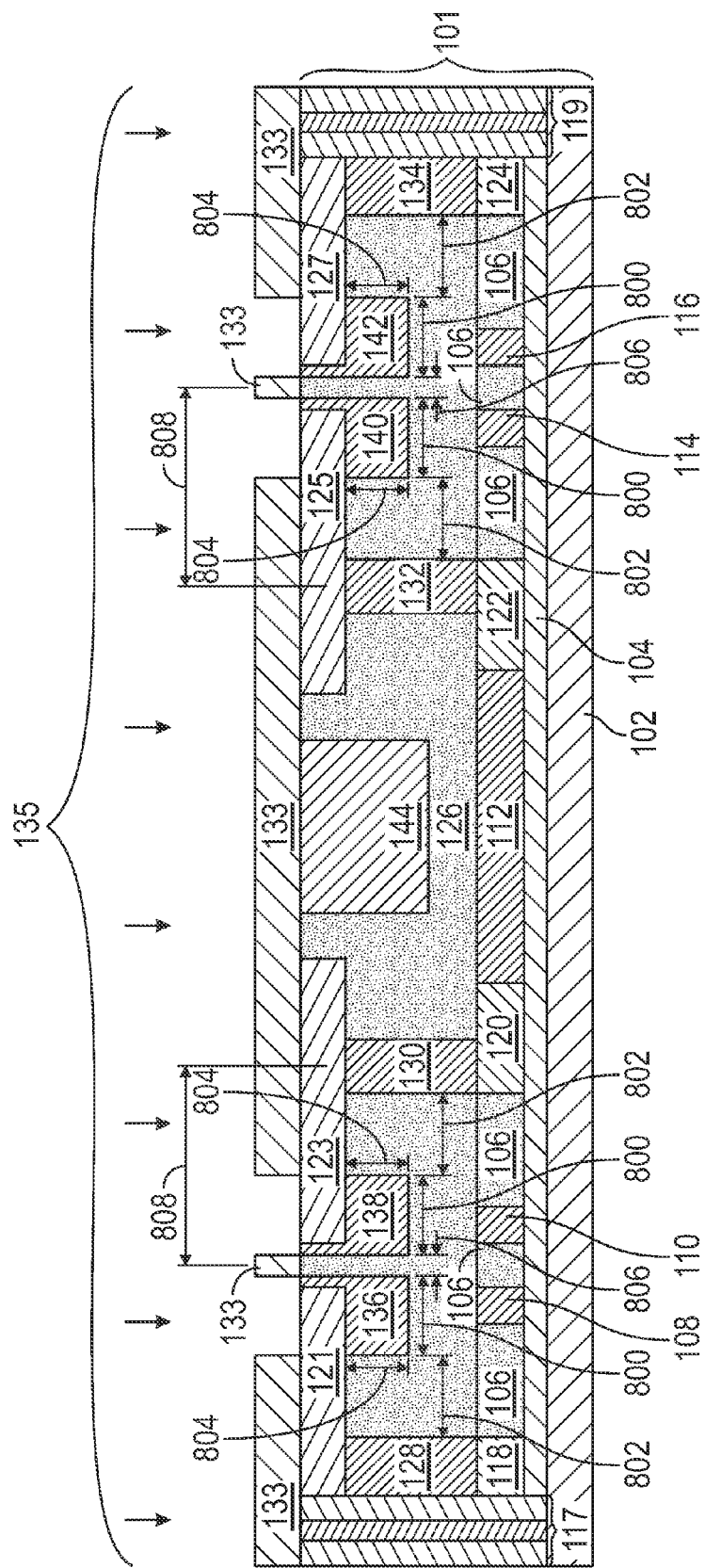

Turning now to FIG. 8, the illustrated fabrication process continues by forming vertical drift regions 136, 138, 140, 142 of semiconductor material within the epitaxial layer 126. The vertical drift regions 136, 138, 140, 142 are formed by masking the substrate 101 with a masking material 133 that is patterned to provide an implantation mask that masks the body portion 170 and the sinker regions 128, 130, 132, 134 while exposing the portions of the drain portions 180, 190 overlying the buried regions 108, 110, 114, 116. In exemplary embodiments, the interior of the drain portions 180, 190 to be used for the drain regions 158, 160 is also masked by portions of the implantation mask 133 having a width that is less than the width of the drain regions 158, 160, such that the implants for the vertical drift regions 136, 138, 140, 142 overlap and abut the respective drain regions 158, 160. That said, in alternative embodiments, the interior (or central) portions of the drain portions 180, 190 may be exposed to provide a continuous or contiguous vertical drift region that overlies both buried regions 108, 110, 114, 116 of a respective drain portion 180, 190 and extends laterally underneath the entire drain region 158, 160 of the respective drain portion 180, 190.

In exemplary embodiments, the vertical drift regions 136, 138, 140, 142 are symmetric with one another and have substantially the same width 800 and depth relative to the surface of the substrate 101. The width 800 is chosen such that the remaining widths 802 of the adjacent lateral drift regions 146, 148, 154, 156 that electrically connect respective vertical drift regions 136, 138, 140, 142 to a respective sinker region 128, 130, 132, 134 are also symmetric and substantially equal to one another. Thus, the distance 802 between the proximal (or facing) lateral boundaries of the edge sinker region 128 and the mirrored vertical drift region 136 (or alternatively, the width 802 of the mirrored lateral drift region 146) is equal to the distance 802 between the proximal (or facing) lateral boundaries of the isolation sinker region 130 and the vertical drift region 138 (or alternatively, the width 802 of the lateral drift region 148), within realistic or practical tolerances or variances. Similarly, the drain portions 180, 190 are symmetric with one another, so that the distance 802 between the proximal (or facing) lateral boundaries of the isolation sinker region 132 and the vertical drift region 140 (or alternatively, the width 802 of the lateral drift region 154) is equal to the distance 802 between the proximal (or facing) lateral boundaries of the isolation sinker region 130 and the vertical drift region 138 (or alternatively, the width 802 of the lateral drift region 148). Additionally, the vertical drift regions 136, 138, 140, 142 have a depth that is greater than the depth of the lateral drift regions 146, 148, 154, 156 so that the lower boundaries of the vertical drift regions 136, 138, 140, 142 extend below the lower boundaries of the lateral drift regions 146, 148, 154, 156 by a nonzero distance 804.

In exemplary embodiments, the depth 804, widths 800, 802, 806, 808, and dopant concentrations are chosen to optimize the BVDSS (which is the sum of the voltage load across the regions 138, 140, 148, 154 and the voltage supported by the central isolated NLDMOS) by depleting the vertical drift regions 138, 140 and the lateral drift regions 148, 154. In one or more embodiments, the width 800 of the vertical drift regions 136, 138, 140, 142 is greater than the width 202 of the buried regions 108, 110, 114, 116 and chosen to result in a separation distance 802 from the isolation ring 175 in the range of about 3 microns to about 8 microns. Additionally, the distance 804 by which the vertical drift regions 138, 140 extend beyond the lower boundaries of the lateral drift regions 148, 154 is greater than 0.6 microns or in the range of 0.5 microns to 1.2 microns. In this regard, the separation distance 802 and distance 804 (or depth) of the extension of the vertical drift regions 138, 140 are chosen to provide remaining portions of the P-type epitaxial material 126 underlying a respective lateral drift region 148, 154 between the respective vertical drift region 138, 140 and the respective sinker region 130, 132 that are capable of vertically depleting the overlying lateral drift region 148, 154 and laterally depleting the respective vertical drift region 138, 140. The extension depth 804 is also chosen to provide remaining portions of the P-type epitaxial material 126 underlying a respective vertical drift region 138, 140 between the respective vertical drift region 138, 140 and a respective buried region 810, 814 that are capable of vertically depleting the respective vertical drift region 138, 140.

In exemplary embodiments, the width 800 of the vertical drift regions 136, 138, 140, 142 is also chosen to provide separation distance 806 underneath the drain regions 158, 160 that allows the remaining P-type epitaxial material 126 between respective pairs of vertical drift regions 136, 138, 140, 142 to deplete the vertical drift regions 136, 138, 140, 142 laterally. Thus, the vertical drift regions 136, 138, 140, 142 may be depleted in three directions. As one example, for a lateral distance 808 between the center of the drain regions 158, 160 and the center of the isolation sinker regions 130, 132 in the range of about 7 microns to about 8 microns, the vertical drift regions 136, 138, 140, 142 have a width 800 in the range of about 3 microns to about 8 microns and are offset from the center of the drain regions 158, 160 by about 0.1 microns or less to provide a separation distance 806 of about 0.8 microns to about 1.6 microns, with an extension depth 804 of about 0.8 microns to about 1.4 microns to achieve full depletion of the vertical drift regions 136, 138, 140, 142 for a drain-to-source voltages in the range of 150V to 220V.

The vertical drift regions 136, 138, 140, 142 are formed by implanting N-type ions, illustrated by arrows 135, in the epitaxial layer 126 using the implantation mask 133 with a dopant concentration in the range of about $1 \times 10^{15}/cm^3$ to about $5 \times 10^{16}/cm^3$ (typically about $2 \times 10^{16}/cm^3$) in a series of one or more implants having energy levels in the range of about 50 keV to about 1000 keV to provide vertical drift regions 136, 138, 140, 142 having a depth in the range of about 1 microns to about 2 microns relative to the surface of the substrate 101 (or alternatively, an extension depth 804 of about 0.8 microns to about 1.4 microns relative to the lower boundary of the lateral drift regions 146, 148, 154, 156). By virtue of the buried doped regions 108, 110, 114, 116 underlying the vertical drift regions 136, 138, 140, 142 helping distribute the drain voltage vertically, a reduced electrical field is achieved at the vertical p-n junctions between the inner lateral boundaries of the vertical drift regions 138, 140 and the remaining portions of P-type epitaxial material 126 underneath the lateral drift regions 148, 154.

Figure 9:
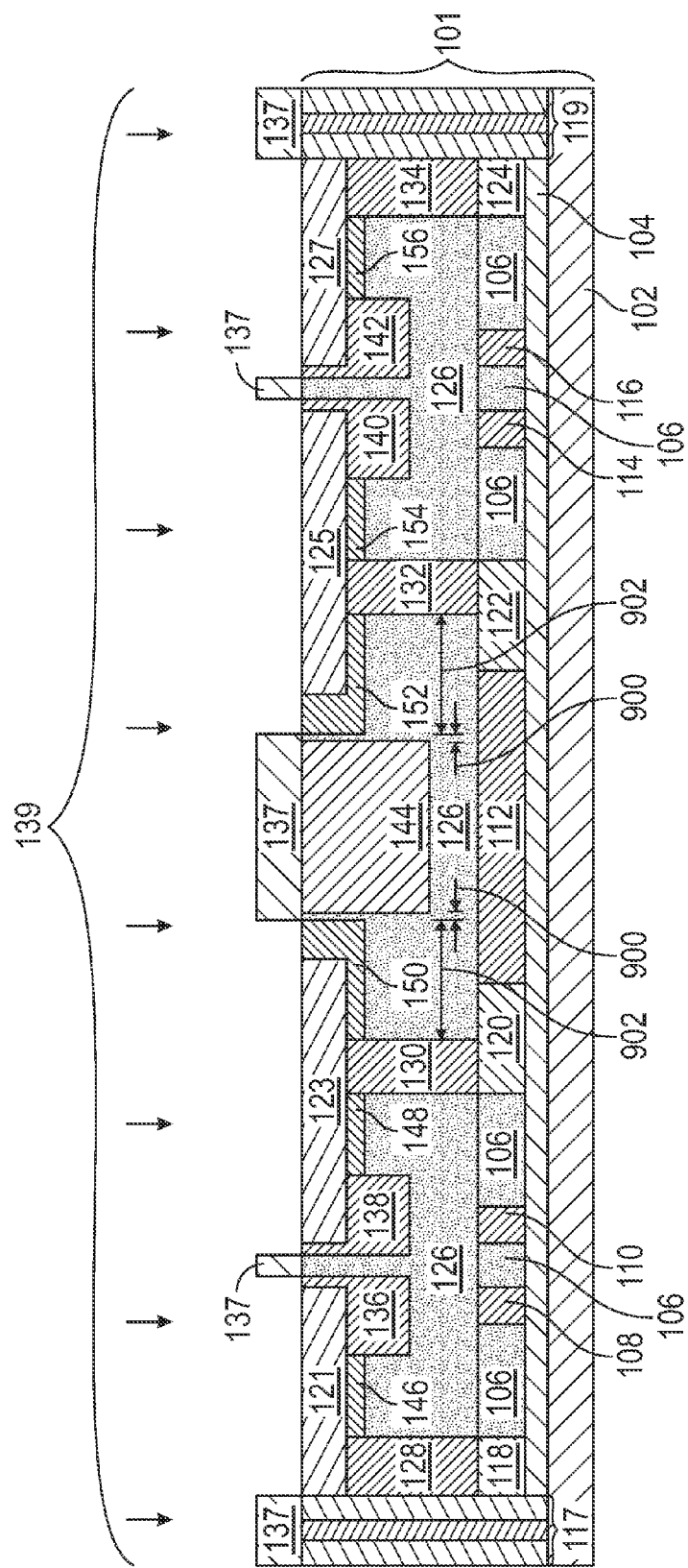

Referring now to FIG. 9, the illustrated fabrication process continues by forming lateral drift regions 146, 148, 150, 152, 154, 156 of semiconductor material within the epitaxial layer 126. The lateral drift regions 146, 148, 150, 152, 154, 156 are formed by masking the substrate 101 with a masking material 137 that is patterned to provide an implantation mask that masks the body well region 144 and portions of the epitaxial layer 126 to be used for the drain regions 158, 160. The lateral drift regions 146, 148, 150, 152, 154, 156 are then formed by implanting N-type ions, illustrated by arrows 139, in the epitaxial layer 126 with a dopant concentration in the range of about $1 \times 10^{15}/cm^3$ to about $5 \times 10^{16}/cm^3$, and more preferably about $1 \times 10^{16}/cm^3$ to provide relatively lightly doped drift regions 146, 148, 150, 152, 154, 156. The ions 139 are implanted at an energy level that results in the drift regions 146, 148, 150, 152, 154, 156 having a depth (after subsequent thermal annealing or any other diffusion) that is greater than the depth of the shallow isolation regions 121, 123, 125, 127 but less than the depth of the vertical drift regions 136, 138, 140, 142 and body well region 144. For example, in one or more embodiments, the ions 139 are implanted at an energy level in the range of about 300 keV to about 1000 keV to provide drift regions 146, 148, 150, 152, 154, 156 with a depth that is at least 0.5 microns greater than the depth of the shallow isolation regions 121, 123, 125, 127. The lateral drift regions 146, 148, 150, 152, 154, 156 are formed such that they abut or otherwise contact an adjacent sinker region 128, 130, 132, 134, thereby electrically connecting the respective lateral drift regions 146, 148, 150, 152, 154, 156 with a respective sinker region 128, 130, 132, 134 adjacent thereto. As illustrated, in some embodiments, the implant mask 137 may also expose the sinker regions 128, 130, 132, 134 and the vertical drift regions 136, 138, 140, 142 such that the implants overlap and ensure lateral electrical connections among the respective N-type regions that are adjacent to one another.

In the illustrated embodiment, the interior (or central) portion of the implant mask 137 is configured such that the interior lateral boundaries of the interior lateral drift regions 150, 152 are offset from the lateral boundaries of the body well region 144 by a nonzero separation distance 900 such that at least a portion of the lighter doped epitaxial material 126 resides laterally between the body well region 144 and a respective lateral drift region 150, 152. By virtue of the lighter doped body portions of epitaxial material 128 between the body well region 144 and the lateral drift regions 150, 152, a reduced electrical field at the p-n junction is achieved, thereby improving the breakdown voltage. In exemplary embodiments, the interior lateral drift regions 150, 152 are symmetric and have substantially the same width 902. The width 902 is chosen to achieve the desired tradeoff between higher BVDSS and lower on-resistance, and in exemplary embodiments, is in the range of about 1.5 microns to about 5 microns.

Referring now to FIG. 10, the fabrication process continues by removing the implantation mask 137 and fabricating a plurality of gate structures 141, 143, 145, 147 overlying the substrate 101. The gate structures 141, 143 overlie the vertical p-n junctions between the body well region 144 and the lateral drift regions 150, 152. Additional gate structures 145, 147 are formed overlying at least a portion of a respective isolation region 123, 125 between the respective gate structure 145, 147 and a respective inner lateral drift region 150, 152. In exemplary embodiments, the gate structures 141, 143 are electrically connected so that they have the same electrical potential and collectively function as the conductive gate electrode for the LDMOS transistor structure, and the gate structures 145, 147 are electrically connected to the gate structures 141, 143 to bias the upper surfaces of the isolation regions 125, 127 to the gate voltage and achieve a double RESURF effect for the corresponding portions of the lateral drift regions 150, 152.

The gate structures 141, 143, 145, 147 may be formed in a conventional manner, for example, by forming one or more layers of dielectric material 149 overlying the substrate 101, forming one or more layers of conductive (or semiconductive) material 151 overlying the dielectric material, and etching the layers of materials 149, 151 to define the gate structures 141, 143, 145, 147. In this regard, the conductive material 151 functions as the conductive gate electrode material of the gate electrode structure 141, 143, 145, 147 and the underlying portion of dielectric material 149 functions as the gate insulator. In accordance with one or more embodiments, the dielectric material 149 is realized as an oxide material that is formed by oxidizing the exposed surfaces of the substrate 101 to a desired thickness (e.g., about 5 nanometers (nm) to about 35 nm for a device with a breakdown voltage greater than 200 V). After the dielectric material 149 is formed, the conductive material 151 may be formed by conformably depositing a conductive material, such as a polycrystalline silicon material, by chemical vapor deposition (CVD) or another suitable deposition process to a desired thickness. After the conductive material 151 is formed, fabrication of the gate structures 141, 143, 145, 147 may be completed by masking the portions of the materials 149, 151 to be utilized for the gate structures 141, 143, 145, 147 and etching the exposed portions of materials 149, 151 using an anisotropic etchant. After forming the gate structures 141, 143, 145, 147, a laterally diffused N-type source extension region 153 may be formed that extends underneath the gate structures 141, 143 in a conventional manner. In some embodiments, gate structures 141, 143 are integral and gate structures 145, 147 are integral, with lateral gaps between the respective pairs of gate structures being removed.

Referring to FIG. 11, after forming gate structures 141, 143, 145, 147, the fabrication process continues by forming doped electrode contact regions 158, 160, 162, 164, 166 for subsequently forming electrical connections between the semiconductor device structure 100 and external circuitry. Prior to forming the contact regions, sidewall spacers 153 may be formed about the sidewalls of the gate structures 141, 143, 145, 147 in a conventional manner (e.g., by conformably depositing a layer of nitride material and anisotropically etching the nitride material to remove the nitride material on top of the gate structures 141, 143, 145, 147). Thereafter, relatively heavily doped N-type drain and source contact regions 158, 160, 162, 164 are formed by implanting ions of the same conductivity-determining impurity type as the drift regions in the exposed portions of the drain portions 180, 190 between isolation regions 121, 123, 125, 127 and in exposed peripheral portions of the body well region 144 proximate the gate structures 141, 143. Additionally, in exemplary embodiments, at least the peripheral portions of the drain regions 158, 160 are formed within or overlying portions of the vertical drift regions 136, 138, 140, 142 such that the regions abut or otherwise contact one another to provide an electrical connection.

For example, in accordance with one embodiment, for an N-channel semiconductor device, N-type drain/source contact regions 158, 160, 162, 164 are formed by implanting N-type ions with a dopant concentration in the range of about $1 \times 10^{19}/cm^3$ to about $1 \times 10^{21}/cm^3$. The drain/source implantation is at an ion implantation energy level that is less than the ion implantation energy level used for the body well region 144 and vertical drift regions 136, 138, 140, 142 such that the depth of the drain/source contact regions 158, 160, 162, 164 is less than the depth of those regions 136, 138, 140, 142, 144. The depth of the drain/source contact regions 158, 160, 162, 164 is also less than the depth of the shallow isolation regions 121, 123, 125, 127. For example, in one embodiment, the drain/source contact regions 158, 160, 162, 164 have a dopant concentration of about $1 \times 10^{21}/cm^3$ and a depth of about 100 nm relative to the surface of the substrate 101. It will be appreciated that the source contact regions 162, 164 function as the source (or source region) for the transistor structure, and the drain contact regions 158, 160 function as the drain of the transistor structure.

After forming the drain/source contact regions 158, 160, 162, 164, the fabrication process continues by forming the body contact region 166 in the body well region 144 between the source regions 164, 164. In a similar manner, the body contact region 166 is formed by implanting ions of the same conductivity-determining impurity type as the body well region 144 into the interior (or central) portion of the body well region 144. For example, in accordance with one embodiment, for an N-channel semiconductor device, the body contact region 166 is formed by implanting P-type ions with a dopant concentration in the range of about $1 \times 10^{19}/cm^3$ to about $1 \times 10^{21}/cm^3$. Similar to the drain/source contact regions 158, 160, 162, 164, the ion implantation energy level is less than the ion implantation energy level used for the body well region 144 such that the depth of the body contact region 166 is less than the depth of the body well region 144. In this regard, the depth and dopant concentration of the body contact region 166 may be substantially same as the depth and dopant concentration of the drain/source contact regions 160, 162, 164 but with the opposite conductivity.

Figure 12:
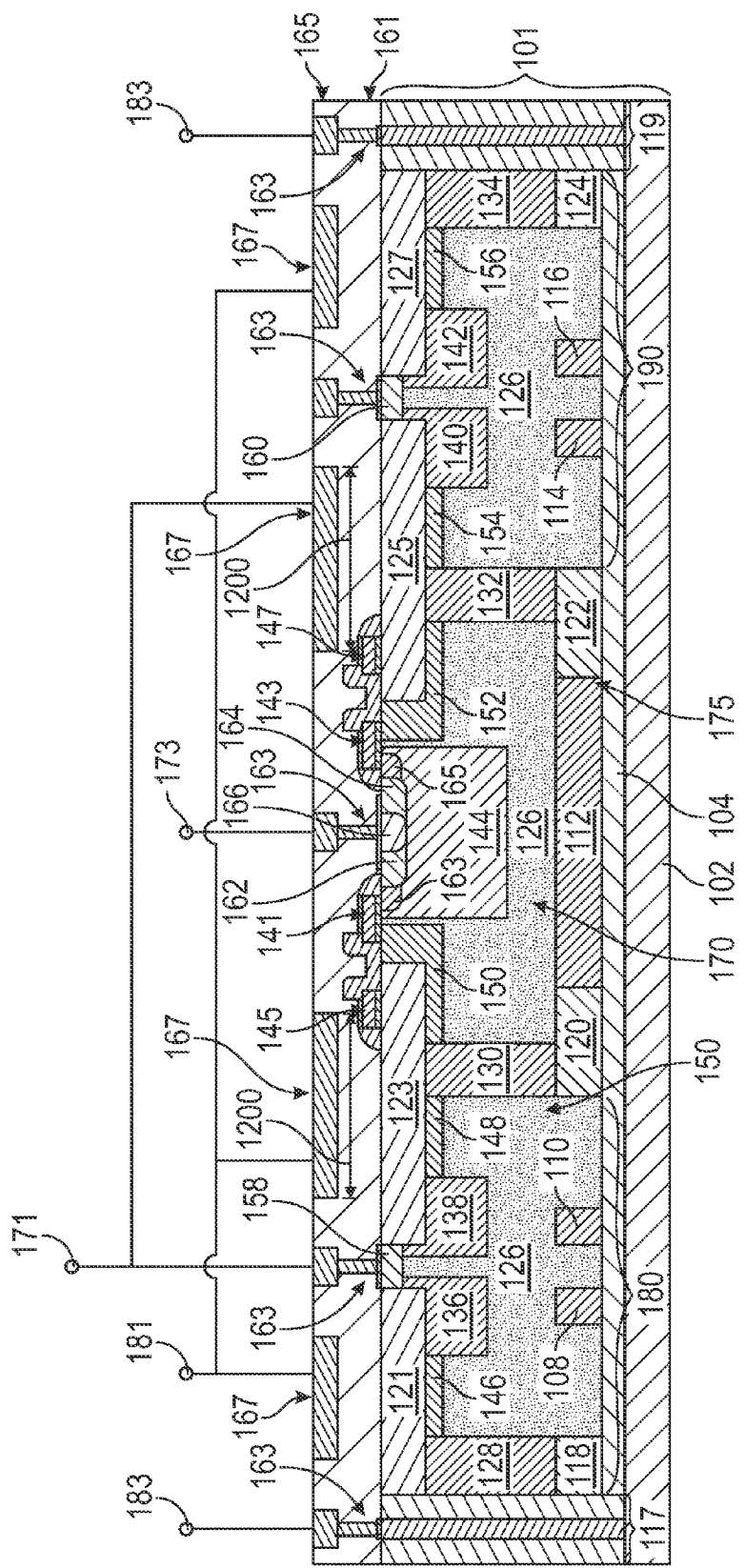

Turning now to FIG. 12, in the illustrated embodiment, after the electrode contact regions 158, 160, 162, 164, 166 are formed, fabrication of the transistor device continues by forming contacts overlying the contact regions 158, 160, 162, 164, 166, the gate structures 141, 143, 145, 147, and the polysilicon contacts to the support layer 102 within the deep isolation regions 117, 119. The contacts 170, 172, 174, 176, 178 may be realized as silicide contacts that are formed in a conventional manner. After forming silicide contacts, fabrication of the device structure 100 continues by forming an interlayer dielectric layer 161 (or via layer) overlying the substrate 101 that includes conductive vias 163 through the interlayer dielectric layer 161 to the contacts. Thereafter, a metal layer 165 (or metallization layer) may be formed overlying the substrate 101 that includes metal traces (or metal portions) that provide the desired electrical interconnections or routing for the device structure 100.

In exemplary embodiments, interlayer dielectric layer 161 and metal layer 165 are configured to support or otherwise provide a direct electrical connection between the drain regions 158, 160 at a drain terminal 171 and a direct electrical connection between the gate structures 141, 143, 145, 147 at a gate terminal 181. In exemplary embodiments, the metal layer 165 includes metal portions 167 overlying the interior portions of the isolation regions 121, 123, 125, 127 that are electrically connected to the same electrical potential as the gate structures 141, 143, 145, 147 at the gate terminal 181. In this regard, the metal portions 167 enhance depletion of the underlying portions of the drift regions 136, 138, 140, 142, 146, 148, 150, 152, 154, 156 (e.g., by vertically depleting them from above) without creating excessive stress on the isolation regions 121, 123, 125, 127 or the underlying buried oxide layer 104. The width 1200 of the inner metal portions 167 may be chosen to be in the range of about 2 microns to about 8 microns.

In the illustrated embodiment, the source and body contact regions 162, 164, 166 are electrically connected by the overlying silicide contact such that they have the same electrical potential, with the interlayer dielectric layer 161 and metal layer 165 supporting or otherwise providing an electrical connection between the source and body contact regions 162, 164, 166 and a source terminal 173. Additionally, the interlayer dielectric layer 161 and metal layer 165 support or otherwise provide an electrical connection between the polysilicon contacts within the deep isolation regions 117, 119 and a terminal 183 configured to receive a ground reference voltage for biasing the support layer 102 of the substrate 101. In one or more embodiments, the source voltage may be the ground voltage, in which case the source terminal 173 is electrically connected to the same ground reference voltage potential at the terminal 183. In such embodiments, a drain-to-source breakdown voltage (BVDSS) of greater than 200 Volts may be achieved by the semiconductor device structure 100. In this regard, as the drain voltage applied to the drain terminal 171 (or drain regions 158, 160) increases relative to the source voltage (e.g., the voltage applied at terminals 173, 183), punch-through between the vertical drift regions 136, 138, 140, 142 and the buried regions 108, 110, 114, 116 will force the voltage of the buried regions 108, 110, 114, 116 to increase proportionally. This, in turn, increases the percentage of the drain voltage that is vertically distributed or otherwise supported by the capacitance provided by the buried layer 104 and reduces the voltage of the isolation ring 175. Additionally, the edge protection regions 128, 134, 136, 142, 146, 156 distribute the drain voltage away from the isolation ring 175 and raise the voltage along the buried layer 104 at the edges of the device structure 100. By increasing the percentage of the drain voltage supported by the buried oxide layer 104 and reducing the percentage of the drain voltage that must be supported by the lateral drift regions 148, 150, 152, 154 between the drain regions 158, 160 and the source regions 162, 164, the overall drain-to-source breakdown voltage (BVDSS) is improved.

For the sake of brevity, conventional techniques related to semiconductor and/or integrated circuit fabrication, power transistors, biasing, device breakdown, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the foregoing detailed description.

In conclusion, devices and methods configured in accordance with example embodiments of the invention relate to:

An apparatus for a semiconductor device structure is provided in one embodiment. The semiconductor device structure includes a body region of semiconductor material having a first conductivity type, a source region of semiconductor material within the body region and having a second conductivity type opposite the first conductivity type, a junction isolation region of semiconductor material having the second conductivity type, a drain region of semiconductor material having the second conductivity type, a first drift region of semiconductor material having the second conductivity type, and a second drift region of semiconductor material having the second conductivity type. The first drift region resides laterally between the drain region and the junction isolation region, the junction isolation region resides laterally between the second drift region and the first drift region, and the second drift region resides laterally between the body region and the junction isolation region. In one embodiment, the junction isolation region comprises a sinker region of semiconductor material having the second conductivity type residing laterally between the first drift region and the second drift region. In a further embodiment, the junction isolation region further comprises a buried region of semiconductor material having the second conductivity type, wherein at least a first portion of the buried region underlies a second portion of the body region residing laterally between the junction isolation region and the source region. In one or more embodiments, the buried region comprises a corner portion of semiconductor material having the second conductivity type, wherein the corner portion underlies the sinker region and at least a third portion of the body region, the corner portion abuts the first portion of the buried region, and a dopant concentration of the corner portion is greater than a dopant concentration of the first portion of the buried region. The second drift region abuts the junction isolation region, the second portion of the body region resides laterally between the second drift region and the source region, and at least a fourth portion of the second drift region overlies the third portion of the body region that resides vertically between the corner portion and the fourth portion of the second drift region. In another embodiment, the second drift region resides laterally between the junction isolation region and the source region, the second drift region abuts the junction isolation region, a portion of the body region resides laterally between the second drift region and the source region, and a gate structure overlies the portion of the body region.

In yet another embodiment, the first drift region comprises a lateral drift region of semiconductor material having the second conductivity type that abuts the junction isolation region and a drift well region of semiconductor material having the second conductivity type, wherein the drift well region abuts the drain region and the lateral drift region and the lateral drift region resides laterally between the drift well region and the junction isolation region. In one embodiment, the semiconductor device structure further comprises a second region of semiconductor material having the first conductivity type, wherein the second region has the lateral drift region and the drift well region formed therein and the junction isolation region resides laterally between the second region and the body region. The semiconductor device structure further comprises a buried region of semiconductor material having the second conductivity type underlying the drift well region, wherein at least a portion of the second region resides vertically between the buried region and the drift well region. In one embodiment, the semiconductor device structure further comprises a dielectric isolation region, an edge region of semiconductor material having the second conductivity type adjacent to the dielectric isolation region, a second lateral drift region of semiconductor material having the second conductivity type that abuts the edge region, and a second drift well region of semiconductor material having the second conductivity type, wherein the second drift well region abuts the drain region and the second lateral drift region, the second lateral drift region resides laterally between the second drift well region and the edge region, the second drift well region and the drift well region are symmetrical, and the second lateral drift region and the lateral drift region are symmetrical.

Another embodiment of a semiconductor device structure comprises a body region of semiconductor material having a first conductivity type, a second region of semiconductor material having the first conductivity type, a drain region of semiconductor material having a second conductivity type opposite the first conductivity type, a source region of semiconductor material having the second conductivity type within the body region, a junction isolation region of semiconductor material having the second conductivity type residing laterally between the body region and the second region. A first drift region of semiconductor material having the second conductivity type within the second region abuts the junction isolation region and resides laterally between the drain region and the junction isolation region and a second drift region of semiconductor material having the second conductivity type abuts the junction isolation region and resides laterally between the source region and the junction isolation region. In one embodiment, the semiconductor device structure further comprises a dielectric isolation region, an edge region of semiconductor material having the second conductivity type adjacent to the dielectric isolation region, and a third drift region of semiconductor material having the second conductivity type within the second region, wherein the third drift region abuts the edge region and resides laterally between the drain region and the edge region. In one embodiment, the first drift region and the third drift region are symmetrical. In another embodiment, the semiconductor device structure comprises a buried region of semiconductor material having the second conductivity type underlying the first drift region, wherein at least a portion of the second region resides vertically between the buried region and the drift region and a width of the buried region is less than a width of the first drift region. In yet another embodiment, the semiconductor device structure further comprises a gate structure overlying a portion of the body region, wherein the portion of the body region resides laterally between the second drift region and the source region.

An embodiment of a method of fabricating a semiconductor device on a semiconductor substrate is also provided. The method comprises forming a body region of semiconductor material having a first conductivity type within the semiconductor substrate, forming a junction isolation region of semiconductor material having a second conductivity type opposite the first conductivity type within the semiconductor substrate, the junction isolation region residing laterally between the body region and a second region of semiconductor material having the first conductivity type, forming a first drift region of semiconductor material having the second conductivity type within the second region, forming a source region of semiconductor material having the second conductivity type within the body region, and forming a drain region of semiconductor material having the second conductivity type within the second region, wherein the first drift region resides laterally between the drain region and the junction isolation region to provide a conductive path between the drain region and the junction isolation region. In one embodiment, the method further comprises forming a second drift region of semiconductor material having the second conductivity type within the body region, wherein the second drift region resides laterally between the junction isolation region and the source region and abuts the junction isolation region. In another embodiment, the method further comprises forming a buried doped region of semiconductor material having the second conductivity type, a portion of the second region of semiconductor material overlying the buried doped region, wherein forming the first drift region comprises forming the first drift region overlying the portion of the second region with a width that is greater than or equal to a width of the buried doped region. In yet another embodiment, the method further comprises forming an edge region of semiconductor material having the second conductivity type within the second region adjacent to a dielectric isolation region and forming a second drift region of semiconductor material having the second conductivity type within the second region, wherein the second drift region resides laterally between the drain region and the edge region to provide a second conductive path between the drain region and the edge region and the second drift region is symmetric to the drift region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:
1. A semiconductor device structure comprising:
   a body region of semiconductor material having a first conductivity type;
   a source region of semiconductor material within the body region, the source region having a second conductivity type opposite the first conductivity type;
   a junction isolation region of semiconductor material having the second conductivity type;
   a drain region of semiconductor material having the second conductivity type;
   a first drift region of semiconductor material having the second conductivity type; and
   a second drift region of semiconductor material having the second conductivity type, wherein:
      the first drift region resides laterally between the drain region and the junction isolation region;
      the junction isolation region resides laterally between the second drift region and the first drift region; and
      the second drift region resides laterally between the body region and the junction isolation region.

2. The semiconductor device structure of claim 1, wherein the junction isolation region comprises a sinker region of semiconductor material having the second conductivity type residing laterally between the first drift region and the second drift region.

3. The semiconductor device structure of claim 2, wherein the junction isolation region further comprises a buried region of semiconductor material having the second conductivity type, at least a first portion of the buried region underlying a second portion of the body region residing laterally between the junction isolation region and the source region.

4. The semiconductor device structure of claim 3, the buried region comprising a corner portion of semiconductor material having the second conductivity type, wherein:

the corner portion underlies the sinker region and at least a third portion of the body region;

the corner portion abuts the first portion of the buried region; and a dopant concentration of the corner portion is greater than a dopant concentration of the first portion of the buried region.

5. The semiconductor device structure of claim 4, wherein:
the second drift region abuts the junction isolation region;
the second portion of the body region resides laterally between the second drift region and the source region; and
at least a fourth portion of the second drift region overlies the third portion of the body region, the third portion of the body region residing vertically between the corner portion and the fourth portion of the second drift region.

6. The semiconductor device structure of claim 1, wherein:
the second drift region resides laterally between the junction isolation region and the source region,
the second drift region abuts the junction isolation region; and
a portion of the body region resides laterally between the second drift region and the source region.

7. The semiconductor device structure of claim 6, further comprising a gate structure overlying the portion of the body region.

8. The semiconductor device structure of claim 1, wherein the first drift region comprises:
a lateral drift region of semiconductor material having the second conductivity type, the lateral drift region abutting the junction isolation region; and
a drift well region of semiconductor material having the second conductivity type, wherein:
the drift well region abuts the drain region and the lateral drift region; and
the lateral drift region resides laterally between the drift well region and the junction isolation region.

9. The semiconductor device structure of claim 8, further comprising a second region of semiconductor material having the first conductivity type, wherein:
the second region has the lateral drift region and the drift well region formed therein; and
the junction isolation region resides laterally between the second region and the body region.

10. The semiconductor device structure of claim 9, further comprising a buried region of semiconductor material having the second conductivity type underlying the drift well region, wherein at least a portion of the second region resides vertically between the buried region and the drift well region.

11. The semiconductor device structure of claim 8, further comprising:
a dielectric isolation region;
an edge region of semiconductor material having the second conductivity type adjacent to the dielectric isolation region;
a second lateral drift region of semiconductor material having the second conductivity type, the second lateral drift region abutting the edge region; and
a second drift well region of semiconductor material having the second conductivity type, wherein:
the second drift well region abuts the drain region and the second lateral drift region;
the second lateral drift region resides laterally between the second drift well region and the edge region;
the second drift well region and the drift well region are symmetrical; and the second lateral drift region and the lateral drift region are symmetrical.

12. A semiconductor device structure comprising:
a body region of semiconductor material having a first conductivity type;
a second region of semiconductor material having the first conductivity type;
a drain region of semiconductor material having a second conductivity type opposite the first conductivity type;
a source region of semiconductor material having the second conductivity type within the body region;
a junction isolation region of semiconductor material having the second conductivity type, the junction isolation region residing laterally between the body region and the second region;
a first drift region of semiconductor material having the second conductivity type within the second region, the first drift region abutting the junction isolation region and residing laterally between the drain region and the junction isolation region; and
a second drift region of semiconductor material having the second conductivity type, the second drift region abutting the junction isolation region and residing laterally between the source region and the junction isolation region.

13. The semiconductor device structure of claim 12, further comprising:
a dielectric isolation region;
an edge region of semiconductor material having the second conductivity type adjacent to the dielectric isolation region; and
a third drift region of semiconductor material having the second conductivity type within the second region, the third drift region abutting the edge region and residing laterally between the drain region and the edge region.

14. The semiconductor device structure of claim 13, wherein the first drift region and the third drift region are symmetrical.

15. The semiconductor device structure of claim 12, further comprising a buried region of semiconductor material having the second conductivity type underlying the first drift region, wherein:
at least a portion of the second region resides vertically between the buried region and the drift region; and
a width of the buried region is less than a width of the first drift region.

16. The semiconductor device structure of claim 12, further comprising a gate structure overlying a portion of the body region, wherein the portion of the body region resides laterally between the second drift region and the source region.

17. A semiconductor device structure comprising:
a P-type body region of semiconductor material;
a N-type source region of semiconductor material within the body region;
a N-type junction isolation region of semiconductor material;
a N-type drain region of semiconductor material;
a first N-type drift region of semiconductor material; and
a second N-type drift region of semiconductor material, wherein:
the first N-type drift region resides laterally between the drain region and the junction isolation region;
the junction isolation region resides laterally between the second N-type drift region and the first N-type drift region; and
the second N-type drift region resides laterally between the body region and the junction isolation region.

18. The semiconductor device structure of claim 17, wherein:
- the junction isolation region comprises a N-type buried region of semiconductor material;
- at least a first portion of the buried region underlies a second portion of the body region; and
- the second portion of the body region resides laterally between the junction isolation region and the source region.

19. The semiconductor device structure of claim 17, further comprising a second P-type region of semiconductor material, wherein:
- the first N-type drift region comprises:
  - a N-type lateral drift region of semiconductor material formed in the second region and abutting the junction isolation region; and
  - a N-type drift well region of semiconductor material formed in the second region and abutting the drain region and the lateral drift region;
- the lateral drift region resides laterally between the drift well region and the junction isolation region; and
- the junction isolation region resides laterally between the second region and the body region.

20. The semiconductor device structure of claim 19, further comprising a N-type buried region of semiconductor material underlying the drift well region, wherein at least a portion of the second region resides vertically between the buried region and the drift well region.

* * * * *